United States Patent
Park et al.

(10) Patent No.: US 8,375,769 B2
(45) Date of Patent: Feb. 19, 2013

(54) METHOD FOR SINR MEASUREMENT WITH CONTROLLING RESIDUAL GAIN IN HSPA/HSDPA SYSTEM AND APPARATUS THEREOF

(75) Inventors: Hung Su Park, Suwon-si (KR); Shin Woo Kang, Suwon-si (KR); Ki Hwan Jeon, Suwon-si (KR); Joo Kwang Kim, Yongin-si (KR); Sung Chul Han, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 310 days.

(21) Appl. No.: 12/859,502

(22) Filed: Aug. 19, 2010

(65) Prior Publication Data

US 2011/0044189 A1    Feb. 24, 2011

(30) Foreign Application Priority Data

Aug. 21, 2009  (KR) ........................ 10-2009-0077456

(51) Int. Cl.
*G01L 23/22*    (2006.01)
(52) U.S. Cl. .................................... 73/35.01
(58) Field of Classification Search ............ 455/91, 455/127.1, 127.2, 130, 132, 137, 138, 150.1, 455/170.1, 177.1; 367/14, 37, 38, 65; 379/1.01, 379/22, 22.03, 22.04, 22.05; 73/35.01, 35.03, 73/35.05; 318/560, 568.11, 568.22, 568.1, 318/567; 330/250, 252, 254
See application file for complete search history.

(56) References Cited

U.S. PATENT DOCUMENTS

| | | | | |
|---|---|---|---|---|
| 6,766,153 | B2 * | 7/2004 | Kozak et al. | 455/232.1 |
| 7,369,990 | B2 * | 5/2008 | Nemer | 704/226 |
| 2002/0187765 | A1 * | 12/2002 | Kozak et al. | 455/232.1 |
| 2005/0098127 | A1 * | 5/2005 | Eiraku | 123/90.15 |
| 2006/0008238 | A1 * | 1/2006 | Suzuki et al. | 385/147 |

* cited by examiner

*Primary Examiner* — Fan Ng
(74) *Attorney, Agent, or Firm* — Jefferson IP Law, LLP (57) ABSTRACT

An apparatus and method for measuring a Signal-to-Interference-plus-Noise Ratio (SINR) by controlling a residual gain in a high speed packet access system are provided. The apparatus includes a gain controller for measuring an intensity of a signal outputted from a residual gain controller, for outputting a gain control signal for controlling a gain of an interval of a preset gain resolution of a radio frequency integrated circuit according to the intensity of measured signal, and for outputting a residual gain value for controlling a residual gain less than the preset gain resolution, wherein the radio frequency integrated circuit gain-controls a signal inputted according to the gain control signal, and the residual gain controller multiplies the gain-controlled signal by the residual gain value to compensate the residual gain.

14 Claims, 6 Drawing Sheets

METHOD FOR SINR MEASUREMENT WITH CONTROLLING RESIDUAL GAIN IN HSPA/HSDPA SYSTEM AND APPARATUS THEREOF

PRIORITY

This application claims the benefit under 35 U.S.C. §119(a) of a Korean patent application filed on Aug. 21, 2009 in the Korean Intellectual Property Office and assigned Serial No. 10-2009-0077456, the entire disclosure of which is hereby incorporated by reference.

BACKGROUND OF THE INVENTION

1. Field of the Invention

The present invention relates to a Signal to Interference-plus-Noise (SINR) measurement method in a high speed packet access system and an apparatus thereof More particularly, the present invention relates to a method for measuring an accurate SINR by controlling a residual gain in a high speed packet access system and an apparatus thereof.

2. Description of the Related Art

Mobile communications systems are being developed into a wireless packet data communications system of high speed and high quality for the provision of data service and multimedia service. Recently, mobile communication systems are being developed to provide a high speed and high quality wireless packet data transmission service of the High Speed Packet Access (HSPA) or the High Speed Downlink Packet Access (HSDPA) of 3GPP. A general Radio Frequency Integrated Circuit (RFIC) for a UMTS/HSDPA/HSPA controls the gain of the received signal. The gain of the RFIC is controlled through the Automatic Gain Control (AGC). The gain of the reception path (RX Path) can be controlled with an interval of 1 dB gain, which generally does not affect the AGC and other operations. However, there is a problem in the measurement of the signal-to-interference-plus-noise ratio (hereinafter, SINR) when the gain control is continued through AGC according to the amount of changed 1 dB gain. If a gain change is generated in an environment in which a high SINR should be measured, the SINR measurement seems to have a problem. On the other hand, the SINR is measured to be good when the gain-control does not exist or is performed at a slow speed as a result of no gain-control situation or slow situation.

Figure 1:
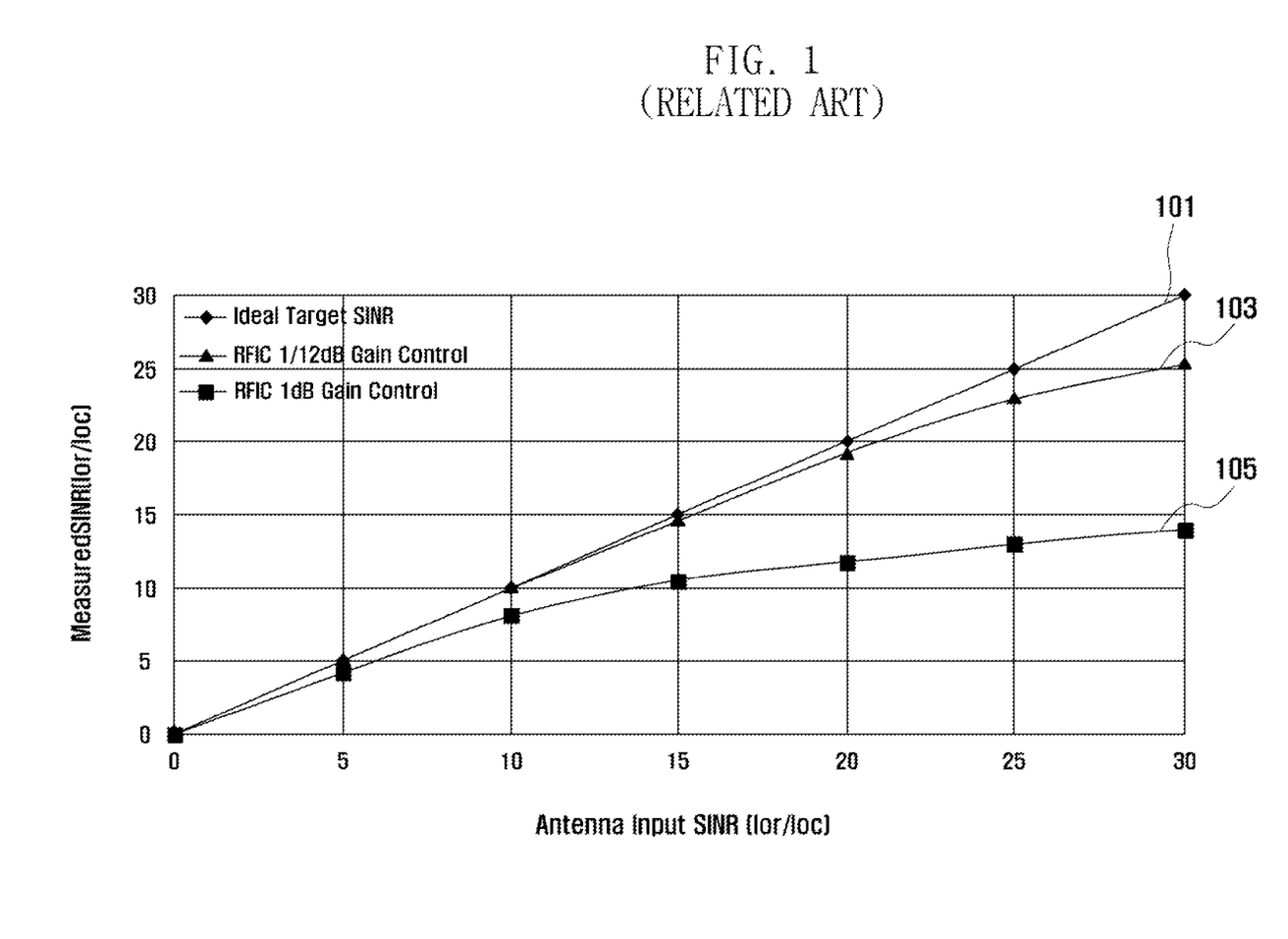
FIG. 1 is a drawing illustrating the measurement result of a Signal-to-Interference-plus-Noise Ratio (SINR) in a receiver according to the related art.

FIG. 1 is a drawing illustrating the measurement result of SINR in a receiver according to the related art.

Referring to FIG. 1, a horizontal axis indicates a SINR which is measured in an antenna. The SINR is measured before a signal is inputted to a modem, and the signal gain is controlled by the RFIC. The measurement result of the SINR is shown by an Ideal Target SINR 101 in the ideal case, a RFIC 1/12 dB Gain control 103 in a case of controlling gain with an interval of 1/12 dB, and a RFIC 1 dB Gain control 105 in a case of controlling gain with an interval of 1 dB. In the case of controlling RFIC 1/12 dB in comparison with the Ideal Target SINR 101, an approximately accurate SINR is measured. On the other hand, in the case of controlling the RFIC 1 dB Gain control 105, the measured SINR is very low compared to the Ideal Target SINR 101 having a high measured SINR. According to the measurement result as shown in FIG. 1, the design of general RFIC can be solved by the control of the high resolution (e.g., 1/12 dB) interval, and not by a 1 dB interval. However, most systems employ a 0.5 dB interval or 1 dB interval. Moreover, the development of minute RFIC having a high resolution can be a great burden in the compatibility side of commercial RFIC and the cost side.

Another method for using the Digital Variable Gain Amplifier (DVGA) is a method of increasing the Effective Number of Bit (ENOB) of the converter (RX-ADC) of the reception end. However, this method is disadvantageous in that an analog IP should be newly developed or requirements are increased due to the increase of bit number of the converter of the reception end.

SUMMARY OF THE INVENTION

An aspect of the present invention is to address the above-mentioned problems and/or disadvantages and to provide at least the advantages described below. Accordingly, an aspect of the present invention is to provide a method of measuring a Signal-to-Interference-plus-Noise Ratio (SINR) through a residual gain control in a high speed packet access system and an apparatus thereof, which is capable of measuring a more accurate SINR through a residual gain compensation without a gain control of additional high resolution of RFIC or the increment of the effective bit of converter.

In accordance with an aspect of the present invention, an apparatus for measuring an SINR by controlling a residual gain in a high speed packet access system is provided. The apparatus includes: a gain controller for measuring an intensity of a signal outputted from a residual gain controller, for outputting a gain control signal for controlling a gain of an interval of a preset gain resolution of a radio frequency integrated circuit according to the intensity of measured signal, and for outputting a residual gain value for controlling a residual gain less than the preset gain resolution, wherein the radio frequency integrated circuit gain-controls a signal inputted according to the gain control signal, and wherein the residual gain controller multiplies the gain-controlled signal by the residual gain value to compensate the residual gain.

In accordance with another aspect of the present invention, a method of measuring an SINR by controlling a residual gain in a high speed packet access system is provided. The method includes: measuring an intensity of a signal outputted from a residual gain controller via a radio frequency integrated circuit by a gain controller, outputting a gain control signal for controlling a gain of an interval of a preset gain resolution of the radio frequency integrated circuit according to the intensity of the signal, and outputting a residual gain value less than the gain resolution, by the gain controller, controlling a gain of a signal inputted according to the gain control signal by the radio frequency integrated circuit, and compensating the residual gain by multiplying the gain-controlled signal by the residual gain value by the residual gain controller.

In accordance with an aspect of the present invention, a method of calculating an SINR for an input signal is provided. The method includes generating a gain control signal based on the input signal and a preset resolution, generating a residual gain lower than the preset resolution, controlling a gain of the input signal based on the gain control signal and the residual gain, and calculating an SINR of the gain-controlled input signal.

According to an aspect of the present invention, the residual gain is calculated without increasing the resolution of RFIC and the Effective Number of Bit (ENOB) of the converter (RX-ADC) of reception end, compensates a received signal for residual gain, and measures the SINR of signal compensated for the residual gain. Accordingly, it is advantageous in that the reliability of the SINR measurement can be increased.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

According to an exemplary embodiment of the present invention, the frequency of a baseband signal is up-converted into a carrier frequency in a transmitter and is transmitted as a Radio Frequency (RF) signal through an antenna. The frequency of the RF signal received in a receiver through antenna is down-converted into a baseband signal. The configuration of the receiver for down-converting into the base band includes an analog RFIC and a digital IC. An exemplary configuration of the receiver is illustrated in FIG. 2.

Figure 2:
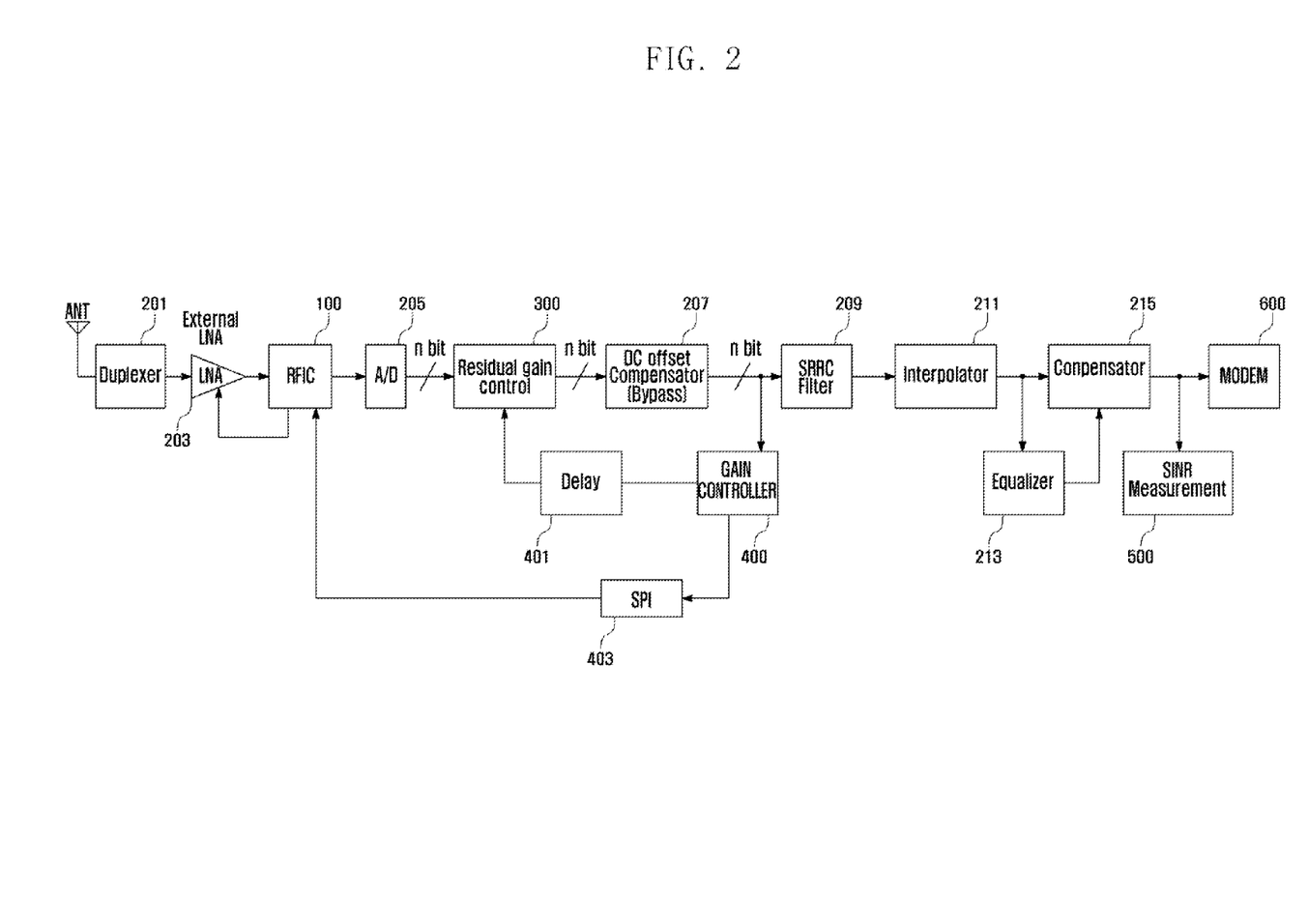
FIG. 2 is a drawing illustrating a part of a receiver in a high speed packet access system according to an exemplary embodiment of the present invention.

FIG. 2 is a drawing illustrating a part of a receiver in a high speed packet access system according to an exemplary embodiment of the present invention.

Referring to FIG. 2, the receiver according to an embodiment of the present invention includes an antenna (ANT), a duplexer 201, an external low noise amplifier (external LNA) 203, a Radio Frequency IC (RFIC) 100, a converter (A/D convertor) 205, a residual gain controller 300, a direct current offset compensator (DC offset compensator) 207, a gain controller 400, a delay controller 401, a control interface 403, a channel filter 209, an interpolator 211, an equalizer 213, a compensator 215, and a SINR measurement 500. The channel filter 209 may be a Square Root Raised Cosine (SRRC) filter, and the control interface may be a Serial Peripheral Interface (SPI) The units corresponding to reference numerals 207 to 215, 300, 400, 401, 403 and 500 can be referred to collectively as the digital IC.

The signal received through the antenna ANT is inputted to a modem via the duplexer 201, the external LNA 203, the RFIC 100, A/D convertor 205, the residual gain controller 300, the DC offset compensator 207, the SRRC Filter 209, the interpolator 211, and the compensator 215. The SINR measurement 500 measures the SINR in data before being inputted to the modem 600.

The gain controller 400 measures the signal strength of the output signal of the DC offset compensator 207, feeds back a gain control signal and a residual gain value to the RFIC 100 and the residual gain controller 300, respectively. The gain control signal is inputted to the RFIC 100 through the control interface 403, and the residual gain value is inputted to the residual gain controller 300 through the delay controller 401.

The RFIC 100 controls the gain of the received signal according to the gain control signal and the residual gain value. The residual gain controller 300 compensates the residual gain of the signal when the gain of the signal is controlled in the RFIC 100.

The detailed description of the duplexer 201, the external LNA 203, the DC offset compensator 207, the SRRC Filter 209, the interpolator 211, the equalizer 213, and the compensator 215, is omitted for clarity. In addition, while additional units may be included, only those units that may be necessary for the measurement of SINR through the residual gain control is illustrated.

Figure 3:
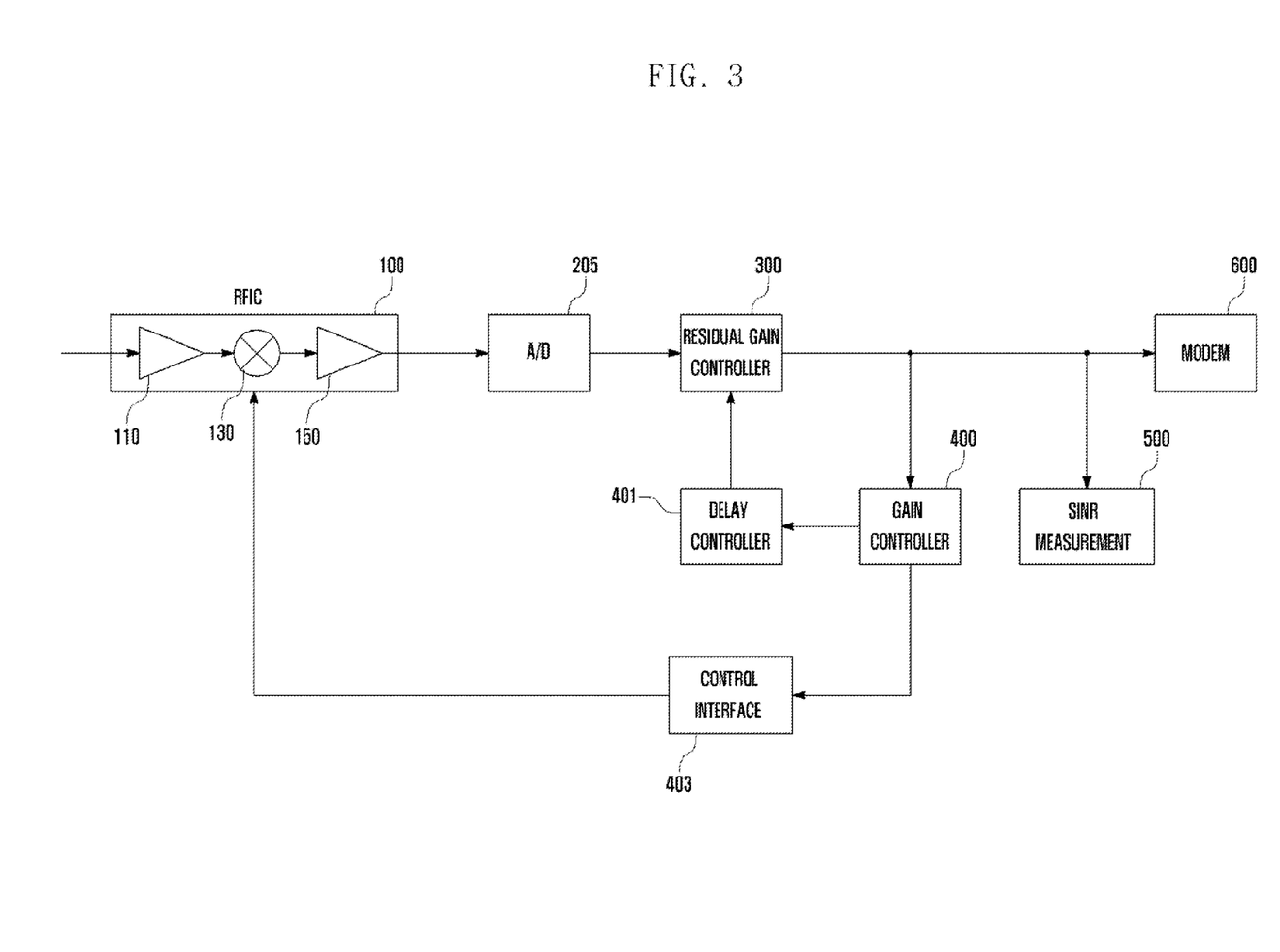
FIG. 3 is a drawing illustrating an apparatus for measuring SINR through a residual gain control according to an exemplary embodiment of the present invention.

FIG. 3 is a drawing illustrating an apparatus for measuring SINR through a residual gain control according to an exemplary embodiment of the present invention.

Referring to FIG. 3, in the apparatus for measuring SINR through residual gain control according to an exemplary embodiment of the present invention, the output of the RFIC 100 is inputted to the residual gain controller 300. The A/D convertor 205 converts an analog signal outputted from the RFIC 100 into a digital signal and inputs the digital signal to the residual gain controller 300.

The gain controller 400 measures the intensity of the output signal of residual gain controller 300. According to the measured signal intensity, the gain controller 400 outputs a gain control signal to the RFIC 100 and feeds a residual gain value back to the residual gain controller 300

The apparatus further includes a control interface 403, a delay controller 401, and an SINR measurement unit 500. The control interface 403 sends a gain control signal to the RFIC 100. The delay controller 401 delays and inputs a residual gain value to the residual gain controller 300. The SINR measurement 500 measures the SINR from the output of the residual gain controller 300.

The RFIC 100 includes a low noise amplifier (LNA) 110, a mixer 130, and an Intermediate Frequency (IF) amplifier 150. The LNA 110 lower-noise amplifies a signal inputted from the antenna (ANT). The mixer 130 mixes the low-noise amplified signal with a given signal, and the IF amplifier 150 converts the mixed signal into an intermediate frequency.

The RFIC 100 controls the gain of the received signal according to the gain control signal outputted from the gain controller 400. The gain control signal controls the gain of the low noise amplifier (LNA) 110, the mixer 130, and the intermediate frequency amplifier (IF Amp) 150. The RFIC 100 controls the gain of the received signal (data) according to the above described gain. Such gain control includes up-converting and down-converting the signal (data).

The gain control signal has a level according to the gain resolution of the RFIC 100. For example, even if the gain controller 400 can control gain with an interval of ¹⁄₁₂ dB, when the gain resolution of the RFIC 100 has an interval of 1 dB, the gain control signal has a level value of controlling gain with an interval of 1 dB.

The residual gain controller 300 compensates an inputted signal according to residual gain which is not reflected by the RFIC 100. The residual gain controller 300 compensates the residual gain by multiplying the gain-controlled signal through the RFIC 100 by the residual gain value. The residual gain value refers to a value less than the gain resolution of the RFIC 100. For example, when a gain for control is 5.083 dB, the RFIC 100 first controls 5 dB with a resolution interval 1 dB, and the residual gain controller 300 then compensates the residual gain 0.083 dB. This residual gain value is outputted from the gain controller 400 and inputted to the residual gain controller 300 via the delay controller 401.

The gain controller 400 measures the intensity of received signal, and feeds back the control signal so that the measured signal intensity may be maintained with a certain level. According to an exemplary embodiment of the present invention, the signal that the gain controller 400 receives is an output signal of the residual gain controller 300. The gain controller 400 measures the intensity of the received signal (gain controlled data) regardless of whether gain control and the compensation of residual gain are performed in the residual gain controller 300.

The gain controller 400 first feeds back the gain control signal controlling the gain of the RFIC 100 so that the signal intensity may be maintained with a certain level. The gain control signal is a signal which measures the intensity of the received signal and controls a gain for making a signal to have a specific magnitude when the intensity of the received signal is greater or smaller than a specific signal strength.

The specific signal strength can be obtained by continuously measuring the output signal of the residual gain controller 300. The measured value is accumulated, and the average of the accumulated value can be the specific signal strength. Accordingly, when the intensity of the measured signal is large, the gain controller 400 outputs the gain control signal to reduce the gain of the RFIC 100, while outputting the gain control signal to enhance the gain of the RFIC 100, when the intensity of the measured signal is small.

The gain control signal may be a level value for controlling the gain of the RFIC 100. The gain control range of the gain control signal may be dependent on the gain resolution of the RFIC 100. When the gain resolution of the RFIC 100 has an interval of 1 dB, the gain control signal becomes a control signal for controlling gain with an interval of 1 dB, although the gain controller 400 can control gain with an interval of ¹⁄₁₂ dB.

The RFIC 100 controls gain according to its own gain resolution. The gain controller 400 provides the residual gain value to the residual gain controller 300 so as to compensate the gain (residual gain) less than the gain resolution of the RFIC 100. The residual gain (e.g., 0.083) which is not controlled can be obtained by subtracting the gain (e.g., 5 dB) controlled by the resolution (e.g., 1 dB) of the gain supported by the RFIC 100, from a gain having a high resolution to be actually controlled (e.g. 5.083).

The control interface 403 is an interface for sending the gain control signal outputted from the gain controller 400 to the RFIC 100. The control interface 403 may be various serial interfaces, such as Inter-Integrated Circuit (I2 C), Serial Bus Interface (SBI), and Serial Peripheral Interface (SPI). For example, as described above, the control interface 103 may be an SPI. However, any method of converting a digital signal into an analog signal and sending a signal controlling the gain of RFIC 100 may be employed according to exemplary embodiments of the present invention.

The delay controller 401 inputs the residual gain value outputted from the gain controller 400 to the residual gain controller 300. The delay controller 401 delays the input of the residual gain value until a signal having a gain which is controlled in the RFIC 100 is input to the residual gain controller 300. Accordingly, discontinuous control can be prevented when compensating the residual gain. The SINR measurement 500 measures the SINR through a signal in which a residual gain is compensated for a signal which is gain-controlled in the above-described RFIC 100.

By using the Common Pilot Channel (CPICH) of the HSPA, the SINR measurement 500 calculates a Received Signal Code Power (RSCP), which is power of signal, and an Interference Signal Code Power (ISCP), which is power of the noise, so that the SINR (RSCP/ISCP=Ior/Ioc) is calculated.

Figure 4:
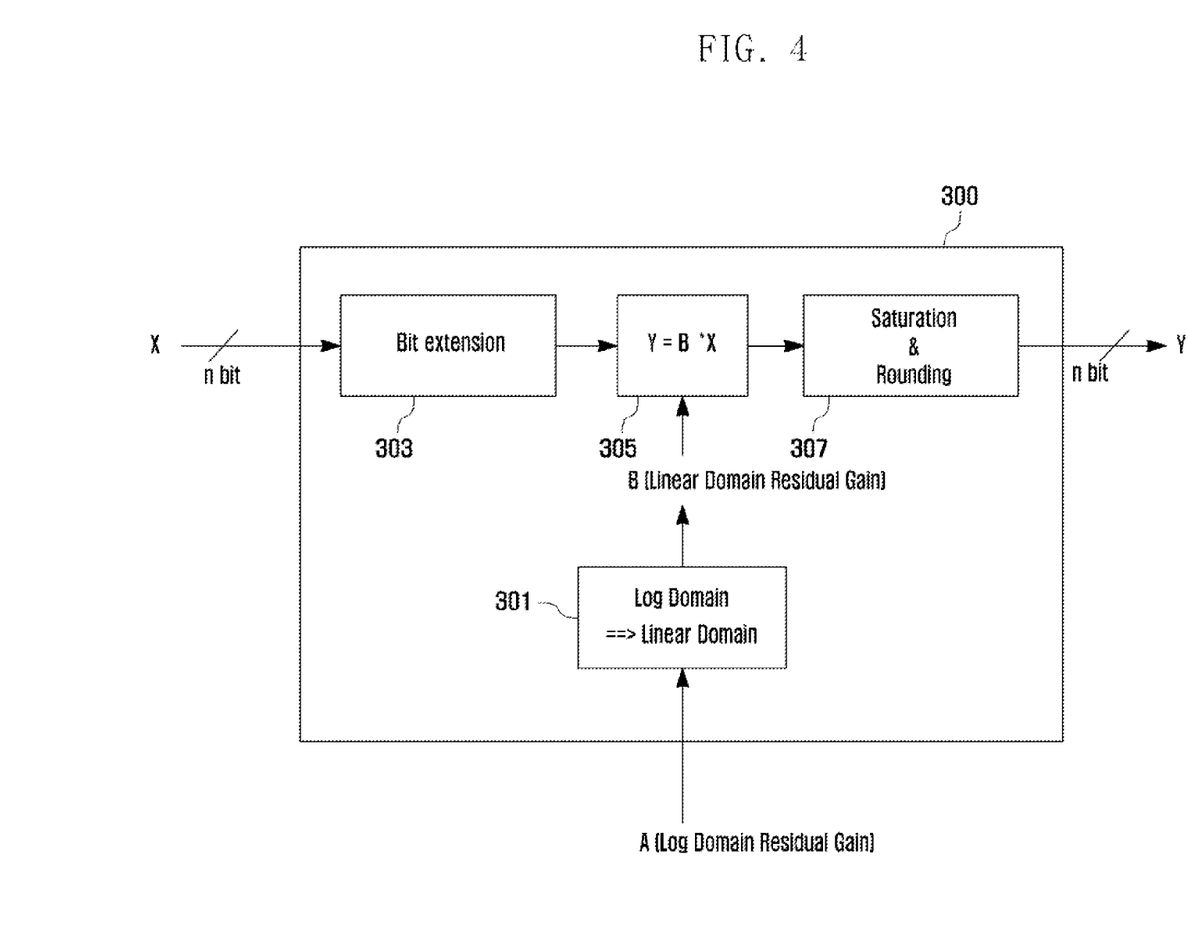
FIG. 4 is a drawing illustrating an apparatus for measuring SINR through a residual gain control according to an exemplary embodiment of the present invention.

FIG. 4 is a drawing illustrating a residual gain controller in an exemplary embodiment of the present invention.

Referring to FIG. 4, the residual gain controller 300 includes a domain conversion module 301, a bit extension module 303, a residual gain compensation module 305, and a saturation and rounding module 307. The residual gain controller 300 receives a residual gain value (A) of the log-domain (dB scale) which is time-delayed by the delay controller 401. The domain conversion module 301 converts the residual gain value (A) of the log-domain into a residual gain value (B) of the linear domain. This conversion method can be expressed as the following Equation 1.

$$A = 20 \log B \qquad \text{Equation 1}$$

In Equation 1, A is a residual gain value of the dB domain measured in the gain controller 400, and B is a residual gain value of the linear domain.

The residual gain controller 300 receives an input signal (X) which is gain-controlled by the RFIC 100. The input signal (X) is a signal converted to digital signal through the converter (ADC) 205. It is assumed that the sampling magnitude of this input signal is n bit. The n bit corresponds to an Effective Number of Bits (ENOB) of ADC that a smaller system requests than in case of using a DVGA method. The bit extension module 303 extends the bit of the input signal to enhance the resolution. The residual gain compensation module 305 multiplies the bit-extended signal by the residual gain value (B) of the linear domain to compensate the residual gain. As described above, the method of compensating the residual gain can be expressed as the following Equation 2.

$$Y = X \times B \qquad \text{Equation 2}$$

In Equation 2, X is an input signal, which is a signal before compensating a residual gain, having a resolution which is enhanced by bit extension. B is a signal representing the residual gain value of the dB domain measured in the gain controller 400 converted into the linear domain.

The residual gain compensation module 305 compensates the residual gain by multiplying the input signal X by the residual gain value B. Y is a signal having a compensated residual gain. The saturation and rounding module 307 performs Saturation and Rounding with respect to the signal Y having a compensated residual gain in accordance with the effective bit (n bit) and outputs it. The effective bit of the outputted signal is controlled to correspond to the inputted bit number (n bit) of the residual gain controller 300. Accordingly, the bit size (n bit) of data is not changed when being inputted and outputted.

Figure 5:
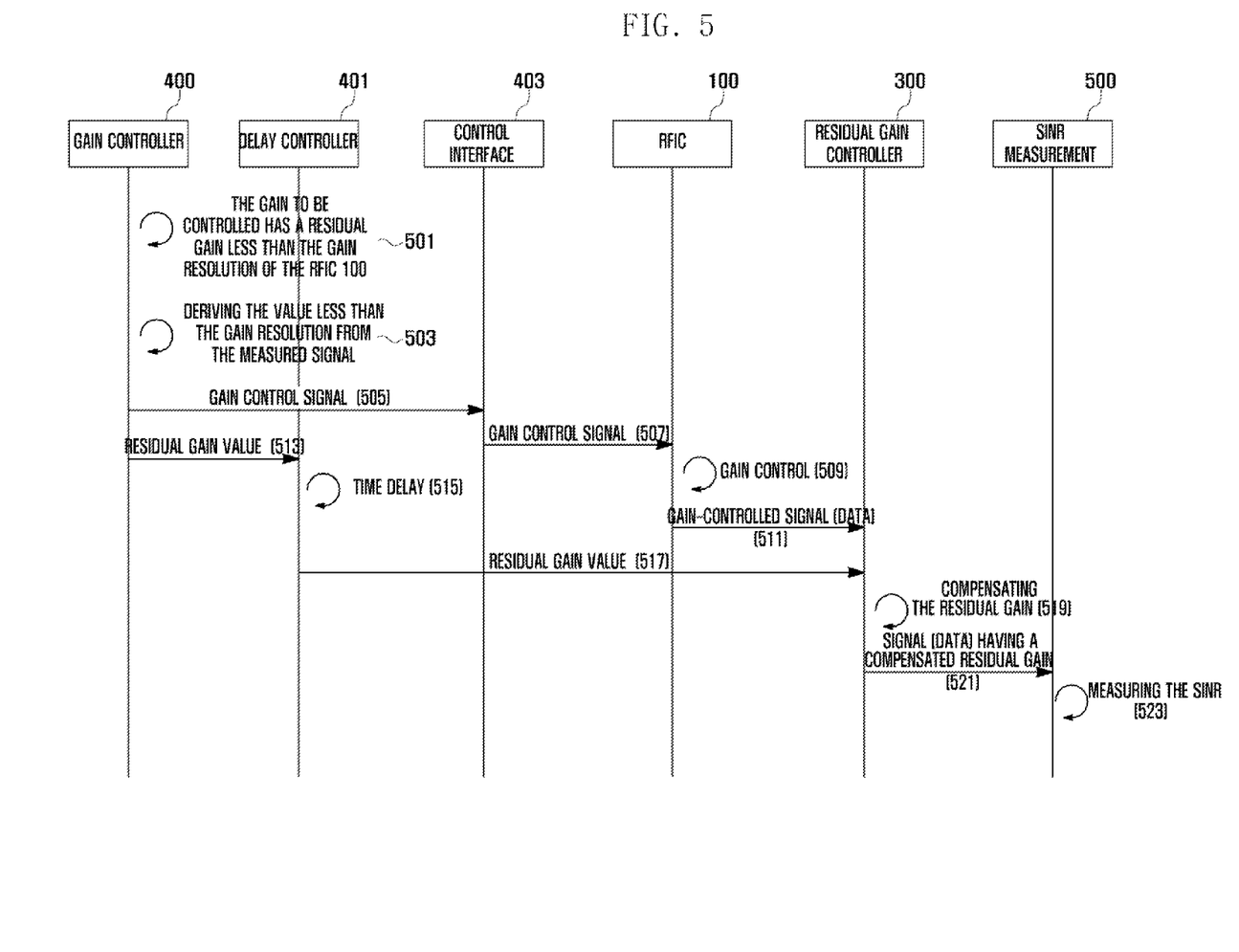
FIG. 5 is a flowchart illustrating a method of measuring an SINR through a residual gain control according to an exemplary embodiment of the present invention.

FIG. 5 is a flowchart illustrating a method of measuring a SINR through a residual gain control according to an exemplary embodiment of the present invention.

Referring to FIG. 5, whether the gain resolution of the RFIC 100 satisfies the gain resolution requested by a system based on the Receive Signal Strength Indicator (RSSI) is determined through the power measurement of the received signal. The gain controller 400 determines whether the gain to be controlled has a gain (residual gain) less than the gain resolution of the RFIC 100 in step 501. If the gain does not include residual gain, the gain may be controlled by the RFIC 100 without the compensation of the residual gain.

When the residual gain is present, the process of gain controlling and compensating the residual gain may be performed according to the method shown in FIG. 5. FIG. 5 illustrates a case where the gain resolution of the RFIC 100 does not satisfy the gain resolution requested by a system. For example, the case shown in FIG. 5 may occur when the gain to be controlled is 5.08 dB and the gain resolution of the RFIC 100 is 1 dB. Accordingly, the gain controller 400 derives the value less than the gain resolution from the measured signal in step 503. The gain controller 400 outputs the gain control signal to the control interface 403 in step 505. The control interface 403 inputs such gain control signal to the RFIC 100 in step 507.

According to the inputted gain control signal, the RFIC 100 controls the gain of the received signal in step 509. The RFIC 100 inputs the gain-controlled signal to the residual gain controller 300 in step 511. The analog output signal of the RFIC 100 is converted into a digital signal by the converter 205 and inputted to the residual gain controller 300. This conversion process is not shown for the purpose of brevity, but would be apparent to one of skill in the art.

In the meantime, the gain controller 400 outputs the residual gain value to the delay controller 401 in step 513. The output of the residual gain value can be simultaneously performed with step 505. The gain controller 400 can simultaneously output the gain control signal and the residual gain value. The delay controller 401 receiving the residual gain value delays the inputting of the residual gain value to the residual gain controller 300 in step 515. The delay controller 401 delays the input so that the signal outputted from the RFIC 100 can be synchronized with the input to the residual gain controller 300.

The delay controller 401 inputs the time-delayed residual gain value to the residual gain controller 300 in step 517. The residual gain controller 300 receiving the residual gain value compensates the residual gain by multiplying the signal (data) gain-controlled by the RFIC 100 by the residual gain value in step 519. The residual gain controller 300 outputs the signal having a compensated residual gain in step 521.

Accordingly, the SINR measurement 500 measures the SINR through a signal, which is gain-controlled, having a compensated residual gain in step 523. The SINR calculates the Received Signal Code Power (RSCP) and the Interference Signal Code Power (ISCP) in the Common Pilot Channel (CPICH), and obtains the SINR (RSCP/ISCP=Ior/Ioc).

Figure 6:
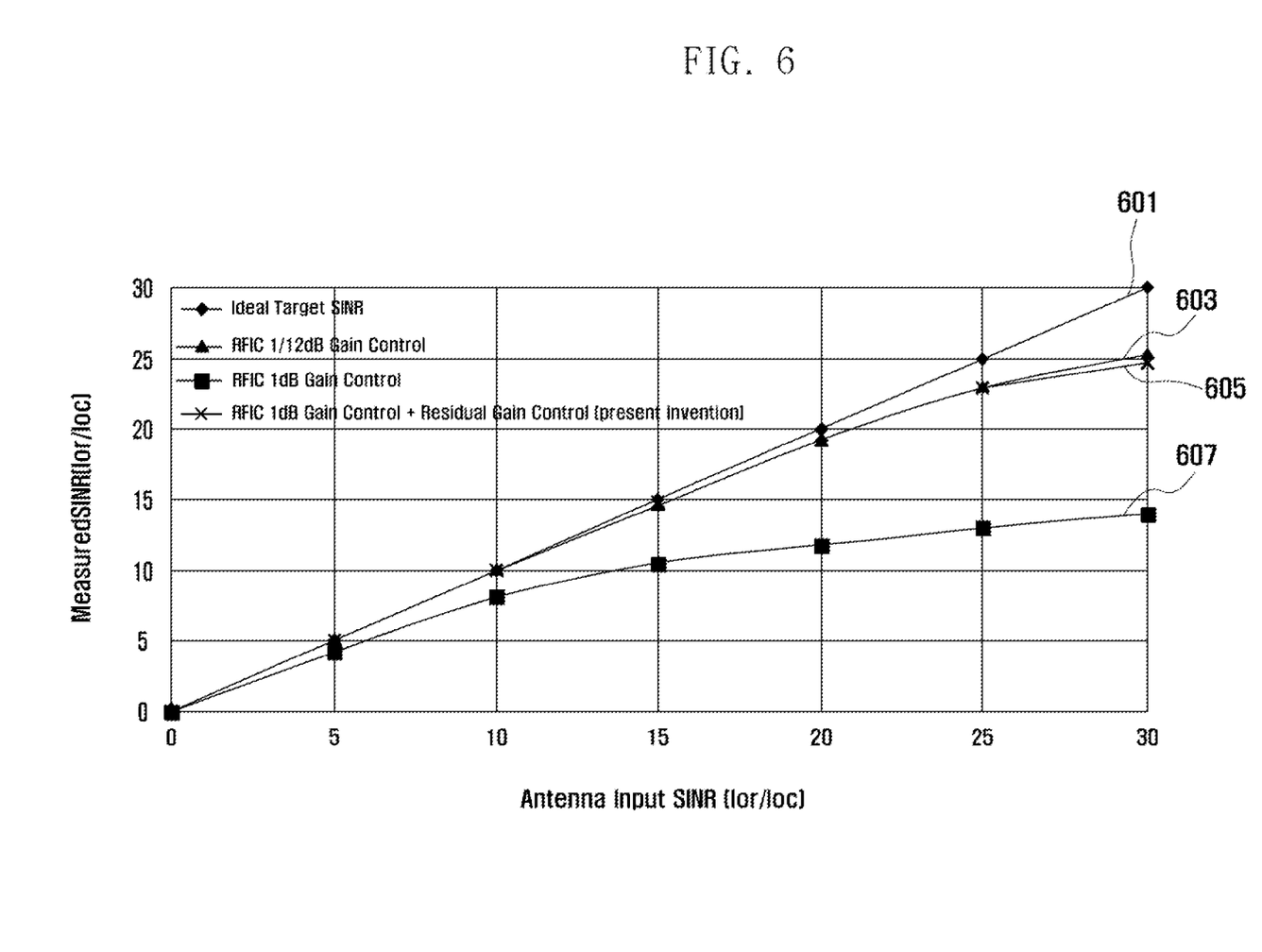
FIG. 6 is a graph illustrating an advantage of the method of measuring SINR through a residual gain control according to an exemplary embodiment of the present invention.

FIG. 6 is a graph illustrating an advantage of the method of measuring SINR through a residual gain control according to an exemplary embodiment of the present invention.

Referring to FIG. 6, the horizontal axis indicates the SINR measured in the signal inputted to the antenna, and the vertical axis indicates the SINR measured in the SINR measurement 500.

This SINR measurement result is indicated by an Ideal Target SINR 601 in an ideal case, a RFIC 1/12 dB Gain control 603 in case of controlling gain with an interval of 1/12 dB, a RFIC 1 dB Gain control 607 in case of controlling gain with an interval of 1 dB, and a RFIC 1 dB Gain control+Residual gain Control 605 in accordance with an embodiment of the present invention.

The method 605 according to an exemplary embodiment of the present invention shows a measurement result that is nearly similar to the case 603 of controlling the RFIC with an interval of 1/12 dB, although the result is lower than the case of Ideal Target SINR 601.

As described above, in the method of measuring SINR through a residual gain control according to an exemplary embodiment of the present invention, a more accurate measurement result can be obtained while not enhancing the gain resolution of RFIC or not increasing the effective bit of the converter (Rx ADC) of the reception end.

The exemplary embodiment of the present invention is illustrated herein with respect to a method for controlling a residual gain for measuring an accurate SINR in the HSPA (HSDPA) system. However, the applicability of the present invention is not limited to this, and may be applied to all fields of applications having a feedback structure of measuring a signal and controlling a gain.

While the invention has been described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus of measuring a Signal-to-Interference-plus-Noise Ratio (SINR) by controlling a residual gain in a high speed packet access system, the apparatus comprising:
 a gain controller for measuring an intensity of a signal outputted from a residual gain controller, for outputting an gain control signal for controlling a gain of an interval of a preset gain resolution of a radio frequency integrated circuit according to the intensity of measured signal, and for outputting a residual gain value for controlling a residual gain less than the preset gain resolution,
 wherein the radio frequency integrated circuit gain-controls a signal inputted according to the gain control signal, and
 wherein the residual gain controller multiplies the gain-controlled signal by the residual gain value to compensate the residual gain.

2. The apparatus of claim 1, further comprising:
an SINR measurement for measuring an SINR of the residual gain compensated signal.

3. The apparatus of claim 2, wherein the gain controller obtains the residual gain by deducting a gain controlled by the preset gain resolution of the radio frequency integrated circuit from a gain of resolution to be actually controlled according to the intensity of the measured signal.

4. The apparatus of claim 1, wherein the residual gain controller comprises:
a domain converter for receiving the residual gain value in a log domain to convert into a linear domain;
a bit extender for extending a bit of the gain-controlled signal to enhance resolution;
a residual gain compensator for multiplying the bit extended signal by the residual gain value converted to the linear domain to compensate residual gain; and
a saturation and rounding module for outputting the residual gain compensated signal according to an effective bit.

5. The apparatus of claim 1, further comprising a time delay unit for delaying an input of the residual gain value to the residual gain controller until the gain-controlled signal is inputted to the residual gain controller.

6. A method of measuring a Signal-to-Interference-plus-Noise Ratio (SINR) by controlling a residual gain in a high speed packet access system, the method comprising:
measuring an intensity of a signal outputted from a residual gain controller via a radio frequency integrated circuit by a gain controller;
outputting a gain control signal for controlling a gain of an interval of a preset gain resolution of the radio frequency integrated circuit according to the intensity of the signal, and outputting a residual gain value less than the gain resolution, by the gain controller;
controlling a gain of a signal inputted according to the gain control signal by the radio frequency integrated circuit; and
compensating the residual gain by multiplying the gain-controlled signal by the residual gain value by the residual gain controller.

7. The method of claim 6, further comprising:
measuring an SINR of the residual gain compensated signal by a SINR measurement.

8. The method of claim 6, wherein the residual gain value is obtained by deducting a gain controlled by the preset gain resolution of the radio frequency integrated circuit from a gain of resolution to be actually controlled according to the intensity of the measured signal.

9. The method of claim 6, wherein the compensating of the residual gain comprises:
receiving the residual gain value in a log domain to convert into a linear domain;
extending a bit of the gain-controlled signal to enhance resolution;
multiplying the bit extended signal by the residual gain value converted to the linear domain and compensating residual gain; and
outputting the residual gain compensated signal according to an effective bit.

10. The method of claim 6, further comprising:
delaying an input of the residual gain value to the residual gain controller until the gain-controlled signal is inputted to the residual gain controller, and inputted, and
inputting the residual gain value to the residual gain controller when the gain-controlled signal is inputted to the residual gain controller.

11. A method of calculating a Signal to Interference-plus-Noise Ratio (SINR) for an input signal, the method comprising:
generating a gain control signal based on the input signal and a preset resolution;
generating a residual gain lower than the preset resolution;
controlling a gain of the input signal based on the gain control signal and the residual gain; and
calculating an SINR of the gain-controlled input signal.

12. The method of claim 11, wherein the controlling of the gain of the input signal comprises:
controlling a gain of the input signal based on the gain control signal; and
multiplying the gain-controlled input signal by the residual gain.

13. The method of claim 11, wherein the generating of the gain control signal comprises:
measuring an intensity of the input signal; and
generating the gain control signal based on the measured intensity and the preset resolution.

14. The method of claim 11, wherein the generating of the residual gain comprises:
subtracting a gain corresponding to the gain control signal from an actual gain to be controlled;
converting the result of the subtracting from a linear domain into a logarithmic domain; and
determining the result of the conversion as the residual gain.

* * * * *